(12) United States Patent
Lee

(10) Patent No.: US 9,401,211 B2
(45) Date of Patent: Jul. 26, 2016

(54) METHOD OF MANUFACTURING SEMICONDUCTOR DEVICE

(71) Applicant: SK hynix Inc., Icheon-si Gyeonggi-do (KR)

(72) Inventor: Dong Hun Lee, Suwon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/619,974

(22) Filed: Feb. 11, 2015

(65) Prior Publication Data

US 2016/0093381 A1    Mar. 31, 2016

(30) Foreign Application Priority Data

Sep. 26, 2014  (KR) .................. 10-2014-0129478

(51) Int. Cl.
- *G11C 16/04* (2006.01)
- *G11C 16/10* (2006.01)
- *H01L 27/115* (2006.01)
- *H01L 21/324* (2006.01)

(52) U.S. Cl.
CPC .............. *G11C 16/10* (2013.01); *H01L 21/324* (2013.01); *H01L 27/11565* (2013.01); *H01L 27/11568* (2013.01); *H01L 27/11582* (2013.01)

(58) Field of Classification Search
CPC .... G11C 11/16; G11C 16/0483; G11C 16/08; G11C 5/063; G11C 11/15; G11C 13/0004; G11C 29/50; G11C 5/02; G11C 11/22; G11C 11/5607; G11C 11/5628; G11C 13/0002; G11C 13/0007; G11C 13/0023
USPC ............ 365/158, 171, 209, 185.17, 104, 145, 365/148, 173, 185.11, 189.07, 200, 201, 365/230.03, 14
See application file for complete search history.

(56) References Cited

U.S. PATENT DOCUMENTS

2012/0281478 A1* 11/2012 Lue .................. H01L 21/28273
365/185.18

FOREIGN PATENT DOCUMENTS

| KR | 1020100023284 A | 3/2010 |
|---|---|---|
| KR | 1020100081610 A | 7/2010 |

* cited by examiner

*Primary Examiner* — Thong Q Le
(74) *Attorney, Agent, or Firm* — William Park & Associates Ltd.

(57) ABSTRACT

Provided is a method of manufacturing a semiconductor device. The method includes forming memory cells which share a data storage layer; performing a first strong program operation on first memory cells, arranged in a checker board pattern among the memory cells; performing a first annealing process after the first strong program operation; performing a second strong program operation on second memory cells arranged in a reverse checker board pattern among the memory cells, and performing a slight program operation on the first memory cells; and performing a second annealing process after the second strong program operation and the slight program operation.

18 Claims, 5 Drawing Sheets

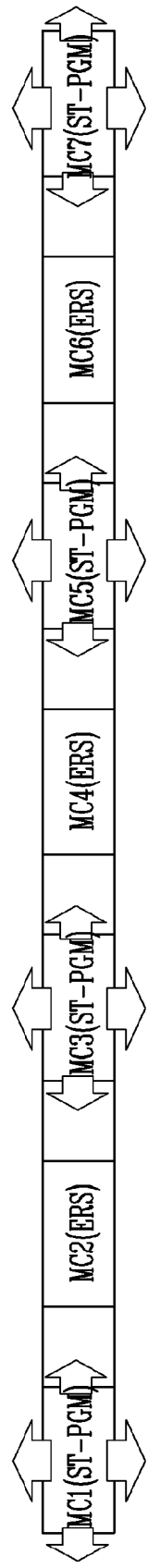
FIG. 4A
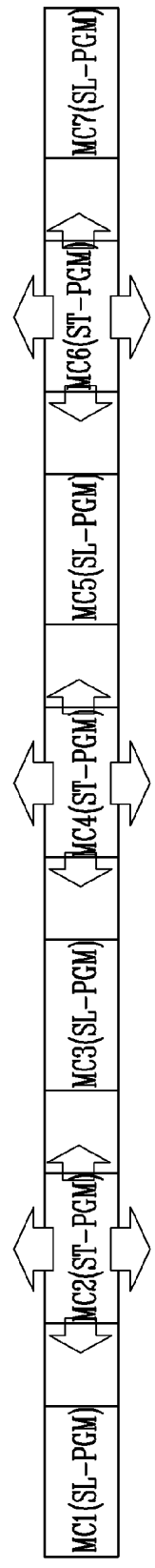
FIG. 4B
FIG. 4C

METHOD OF MANUFACTURING SEMICONDUCTOR DEVICE

CROSS-REFERENCE TO RELATED APPLICATION

The present application claims priority to Korean patent application number 10-2014-0129478 filed on Sep. 26, 2014, in the Korean Intellectual Property Office, the entire disclosure of which is incorporated by reference herein.

BACKGROUND

1. Technical Field

The invention relates to a method of manufacturing a semiconductor device. More specifically, the invention relates to a method of manufacturing a semiconductor device including a memory cell.

2. Related Art

A memory device is classified into a volatile memory device and a nonvolatile memory device based on maintenance of data when a power supply cuts off. The volatile memory device is a memory device, from which data is erased when the power supply cuts off, and a DRAM and an SRAM are included therein. The nonvolatile memory device is a memory device, which maintains stored data although the power supply cuts off, and includes a flash memory device.

The nonvolatile memory element is mainly used in a portable electronic device such as a cellular phone, a digital camera, an MP3 player, and/or the like, and is required to improve a driving speed and increase a storage capacity of the memory device by the miniaturization and high capacity tendency of a recent portable electronic device. Also, in order to improve reliability of stored data, a method for improving data retention characteristics is required.

SUMMARY

An aspect of the invention provides a method of manufacturing a semiconductor device including forming memory cells which share a data storage layer. The method also includes performing a first strong program operation on first memory cells arranged in a checker board pattern among the memory cells. Further, the method includes performing a first annealing process after the first strong program operation. In addition, the method includes performing a second strong program operation on second memory cells arranged in a reverse checker board pattern among the memory cells, and performing a slight program operation on the first memory cells. Further, the method includes performing a second annealing process after the second strong program operation and the slight program operation.

An aspect of the invention provides a method of manufacturing a semiconductor device including forming memory strings including memory cells. The method also includes programming first memory cells arranged in a checker board pattern among the memory cells as a first threshold voltage. In addition, the method includes performing a first annealing process to remove traps in the first memory cells. The method also includes programming second memory cells arranged in a reverse checker board pattern among the memory cells as the first threshold voltage, and programming the first memory cells as a second threshold voltage lower than the first threshold voltage. Further, the method includes performing a second annealing process to remove traps in the second memory cells.

In an embodiment, a semiconductor device may include first memory cells configured in a check board pattern and to receive a first strong program operation, slight program operation, a first annealing process after the first strong program operation and a second annealing process after the slight program operation. The semiconductor device may also include second memory cells configured in a reverse checker board pattern and to receive a second strong program operation and a second annealing process after the second strong program operation.

BRIEF DESCRIPTION OF THE DRAWINGS

FIGS. 4A to 4C are views illustrating a method of manufacturing a semiconductor device according to s an embodiment of the invention;

DETAILED DESCRIPTION

Figure 1A:
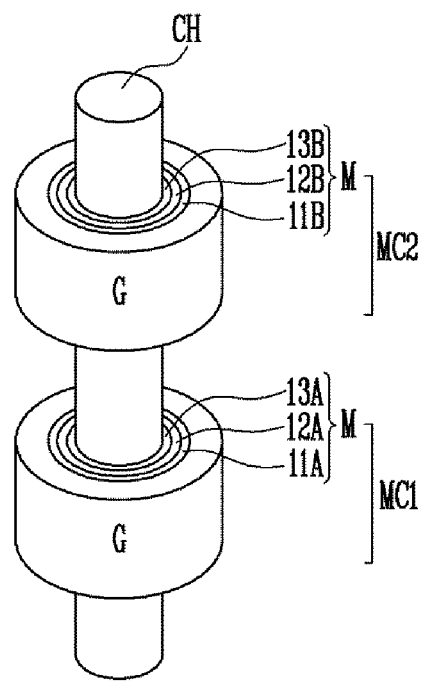
FIGS. 1A to 1C are views illustrating a structure of a semiconductor device according to an embodiment of the invention.

Hereinafter, best modes of the invention will be explained. In the figures, the thicknesses of layers and regions are expressed for convenience of the explanation, and may be exaggerated with respect to an actual physical thickness. In the explanation of the invention, a structure not related to the scope of the invention may be omitted. In numbering reference numerals to the structural parts of each figure, like numerals may refer to like elements throughout the description of the figures although the reference numerals are displayed in different figures. Accordingly, the invention is directed to a method of manufacturing a semiconductor device capable of improving data retention characteristics.

Figure 1B:
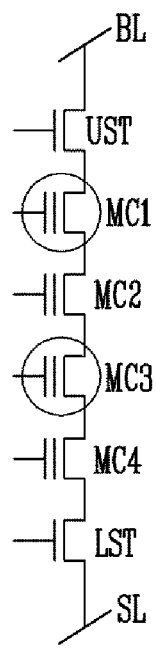
Figure 1C:
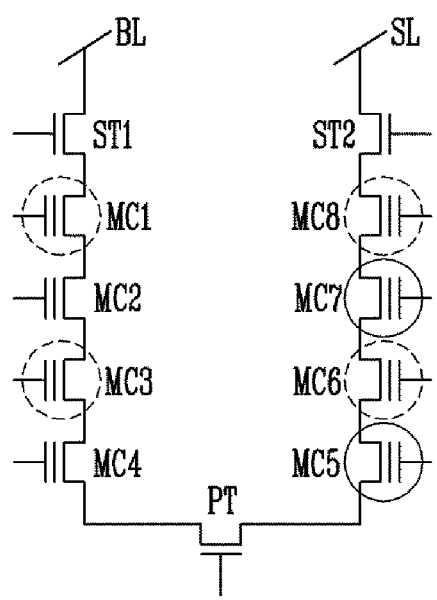

FIG. 1A, a perspective view illustrating a structure of a memory cell according to an embodiment of the invention. Further, FIGS. 1B to 1C are circuit views illustrating a structure of a memory string according to an embodiment of the invention.

Referring to FIG. 1A, memory cells MC1 and MC2 may be stacked in a vertical direction and arranged in 3-dimensions. In addition, each of the memory cells MC1 and MC2 includes a channel layer CH, a memory layer M, and a gate electrode G. The channel layer CH may be in a pillar shape. In addition, the channel layer CH may be in a shape having a completely filled central area, or a shape having an opened central area, or in a shape of a combination thereof. In addition, an insulating layer may be filled in the opened central area.

The memory layer M may be a multi-layered dielectric layer. The memory layer M may also include tunnel insulating layers 13A and 13B, data storage layers 12A and 12B, and charge blocking layers 11A and 11B which surround the channel layer CH and are sequentially stacked. The data storage layers 12A and 12B may include silicon, a nitride, a nanodot, a phase change material, and/or the like. In addition, a memory layer M of a first memory cell MC1 may be electrically coupled to a memory layer M of a second memory cell MC2. More specifically, the first memory cell MC1 and the second memory cell MC2 may share the memory layer M. Further, in particular, the first memory cell MC1 and the second memory cell MC2 may share the data storage layers 12A and 12B.

A gate electrode G may include silicon (Si), tungsten (W), tungsten nitride (WNx), titanium (Ti), titanium nitride (TiN), tantalum (Ta), tantalum nitride (TaN), and/or the like. In addition, a gate electrode of the first memory cell MC1 is electrically insulated from a gate electrode G of the second memory cell MC2 by an insulating layer interposed therebetween. Accordingly, the first memory cell MC1 and the second memory cell MC2 may be separately operated. The gate electrode G may surround the data storage layers 12A and 12B.

A method of manufacturing the memory cells MC1 and MC2 having the above-mentioned structure will be briefly described as follows. First material layers and second material layers are alternately stacked. The first material layers may be sacrificial layers of a nitride and/or the like. Further, the second material layers may be insulating layers of an oxide and/or the like. Then, an opening, which passes through the first and second material layers, is formed. Then, a memory layer M and a channel layer CH are sequentially formed in the opening. Further, a slit, which passes through the first and second material layers, is formed, and then, first material layers exposed through the slit are removed. Gate electrodes G are then formed in an area from which the first material layers are removed. For reference, when the first material layers are conductive layers such as polysilicon layers and the second material layers are oxide layers, the process of substituting the first material layers with the gate electrodes G may be omitted. Instead, a process of silicidizing the first material layers through a slit may be performed. In addition, when the first material layers are conductive layers such as doped polysilicon layers and the second material layers are sacrificial layers such as undoped polysilicon layers, and/or the like, the second material layers may be substituted by insulating layers. According to the above-mentioned processes, the stacked memory cells MC1 and MC2 may be simultaneously formed.

Referring to FIG. 1B, the memory string may be arranged in a straight line shape extended in a vertical direction from a surface of a substrate. Accordingly, at least one lower select transistor LST, a plurality of memory cells MC1 to MC4, and at least one upper select transistor UST, which are sequentially stacked, constitute one memory string.

In this instance, memory cells MC1 to MC4 includes first and third memory cells MC1 and MC3 arranged in a checker board pattern. In addition, second and fourth memory cells MC2 and MC4 are arranged in a reverse checker board pattern. For example, the memory cells arranged in the checker board pattern may be odd memory cells. Further, the memory cells arranged in the reverse checker board pattern may be even memory cells.

Referring to FIG. 1C, a memory string may be arranged in a U-shape. In this instance, at least one first select transistor ST1, a plurality of memory cells MC1 to MC4, a pipe transistor PT, a plurality of memory cells MC5 to MC8, and at least one second select transistor ST2, which are electrically coupled in series, constitute one memory string. Memory strings may include memory cells.

In an embodiment, a checker board pattern may be determined based on the memory cells MC1 to MC8 included in one memory string. In this case, the memory cells MC1 to MC8 included in the one memory string includes first, third, fifth, and seventh memory cells MC1, MC3, MC5, and MC7 arranged in the checker board pattern. IN addition, the memory cells MC2, MC4, MC6, and MC8 are arranged in the reverse checker board pattern.

In an embodiment, when the memory string is arranged in the U-shape, the checker board pattern may be determined based on memory cells MC1 to MC4 or MC5 to MC8 included in a half memory string. In this case, a left side half memory string, which is classified on the basis of the pipe transistor PT, includes first and third memory cells MC1 and MC3 arranged in a checker board pattern. Further, second and fourth memory cells MC2 and MC4 are arranged in a reverse checker board pattern. In addition, a right side half memory string includes fifth and seventh memory cells MC5 and MC7 arranged in a checker board pattern and sixth and eighth memory cells MC6 and MC8 arranged in a reverse checker board pattern. In the alternative, the right side half memory string includes sixth and eighth memory cells MC6 and MC8 arranged in a checker board pattern and fifth and seventh memory cells MC5 and MC7 arranged in a reverse checker board pattern. FIGS. 1B and 1C also illustrate source lines SL and bit lines BL.

Figure 2A:
FIGS. 2A and 2B are views illustrating a method of manufacturing a semiconductor device according to an embodiment of the invention.
Figure 2B:
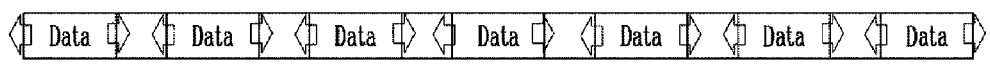

Referring to FIGS. 2A and 2B, views illustrating a method of manufacturing a semiconductor device according to an embodiment of the invention are shown.

In FIG. 2A, after memory cells MC1 to MC7 are formed, a program operation is performed on all of memory cells MC1 to MC7. The memory cells MC1 to MC7 may share a data storage layer, and the data storage layer may include a nitride. Accordingly, in a program operation, charges are injected into the data storage layer of each of the memory cells MC1 to MC7. In addition, threshold voltages of the memory cells MC1 to MC7 are changed.

Then, an annealing process is performed on programmed memory cells MC1 to MC7. For example, a high temperature baking process is performed. The high temperature annealing process is performed so as to forcibly discharge charges stored in the data storage layer. When the charges stored in the memory cells MC1 to MC7 are discharged, since the discharged charges neutralize traps of a low energy level which exist along a path, damage of data by charge loss generated when next data is stored may be prevented.

When the annealing process is performed, the charges stored in the data storage layer are transported in a direction to a gate electrode or a direction to the channel layer, and thus, traps along a corresponding path are neutralized. However, in an embodiment of the invention, since the program operation is performed on all of the memory cells MC1 to MC7, a difference between electric field levels of adjacent memory cells does not exist. Accordingly, charges are not transported between the adjacent memory cells MC1 to MC7, and thus, the traps, which exist along the corresponding path, may not be removed.

In FIG. 2B, data is stored in each of the memory cells MC1 to MC7. In the memory cells according to an embodiment of the invention, as described with reference to FIG. 2A, since the traps are removed through the program operation and annealing processes, charge loss in the direction to the gate electrode and the direction to the channel layer may be minimized. However, since the traps still exist along the path between the adjacent memory cells MC1 to MC7, the charges are discharged between the adjacent memory cells MC1 to MC7 and the stored data may be damaged.

Figure 3A:
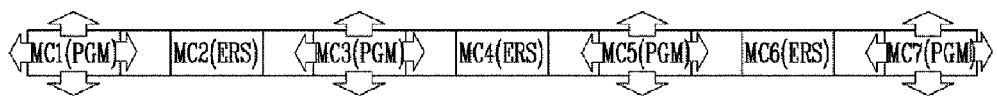
FIGS. 3A to 3C are views illustrating a method of manufacturing a semiconductor device according to an embodiment of the invention.
Figure 3B:
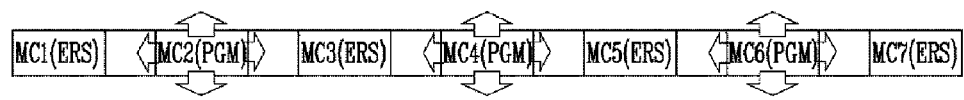
Figure 3C:
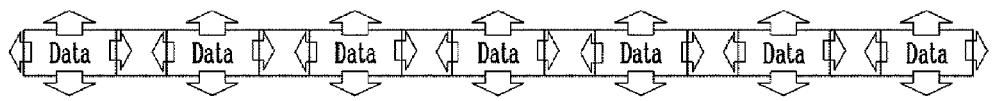

Referring to FIGS. 3A to 3C, views illustrating a method of manufacturing a semiconductor device according to an embodiment of the invention are shown. Hereinafter, any repetitive explanations will be omitted.

In FIG. 3A, after memory cells MC1 to MC7 are formed, a program operation is performed on some of first memory cells MC1, MC3, MC5, and MC7. The first memory cells MC1, MC3, MC5, and MC7 may be odd (or even) memory cells, or memory cells arranged in a checker board pattern. Remaining second memory cells MC2, MC4, and MC6, on which the program operation is not performed, are in an erase state.

An annealing process is then performed on the memory cells MC1 to MC7. A difference exists between electric field levels of adjacent memory cells MC1 to MC7. As a result, charges stored in a data storage layer of the first memory cells MC1, MC3, MC5, and MC7 are discharged in a direction to a gate electrode, a direction to a channel layer, and a direction to the adjacent second memory cells MC2, MC4, and MC6. Further, traps which exist along a path of the charges are removed.

In FIG. 3B, a program operation is performed on the second memory cells MC2, MC4, and MC6. The second memory cells MC2, MC4, and MC6 may be even (or odd) memory cells, or memory cells arranged in a reverse checker board pattern. The first memory cells MC1, MC3, MC5, and MC7, on which the program operation is not performed, are in an erase state.

An annealing process is then performed on the memory cells MC1 to MC7. A difference exists between electric field levels of adjacent memory cells MC1 to MC7. Accordingly, charges stored in a data storage layer of the second memory cells MC2, MC4, and MC6 are discharged in a direction to a gate electrode, a direction to a channel layer, and a direction to the adjacent first memory cells MC1, MC3, MC5, and MC7. In addition, traps which exist along a path of the charges are removed.

However, according to an embodiment of the invention, when the annealing process is performed to remove the traps adjacent to the second memory cells MC2, MC4, and MC6, the first memory cells MC1, MC3, MC5, and MC7 are in an erase state. Thus, during the annealing process, charges, which neutralize traps adjacent to the first memory cells MC1, MC3, MC5, and MC7, are untrapped, and thus, traps may be regenerated as a result.

Referring to FIG. 3C, data is stored in each of the memory cells MC1 to MC7. The program operation and annealing processes are repeated several times on the memory cells of the embodiment of the invention, as described with reference to FIGS. 3A and 3B. In addition, the traps are removed from adjacent to the memory cells MC1 to MC7. However, since traps, which are already removed during the repeating of the annealing processes, may be regenerated, the charges in the memory cells MC1 to MC7 may be discharged and stored data may be damaged.

Referring to FIGS. 4A to 4C, views illustrating a method of manufacturing a semiconductor device according to an embodiment of the invention are shown. Hereinafter, any repetitive explanations will be omitted.

In FIG. 4A, after memory cells MC1 to MC7 are formed, a strong program operation is performed on some of first memory cells MC1, MC3, MC5, and MC7. In the strong program operation, the first memory cells MC1, MC3, MC5, and MC7 are programmed as a first threshold voltage. For example, the first threshold voltage may be in a range of 4 to 6 V.

An annealing process is then performed on the memory cells MC1 to MC7. A difference exists between electric field levels of adjacent memory cells MC1 to MC7. Accordingly, charges stored in a data storage layer of the first memory cells MC1, MC3, MC5, and MC7 are discharged in a direction to a gate electrode, a direction to a channel layer, and a direction to adjacent second memory cells MC2, MC4, and MC6. In addition, traps which exist along a path of the charges are removed.

In FIG. 4B, a slight program operation is performed on the first memory cells MC1, MC3, MC5, and MC7. Further, a strong program operation is performed on the second memory cells MC2, MC4, and MC6. In the strong program operation, the second memory cells MC2, MC4, and MC6 are programmed as the first threshold voltage. In addition, in the slight program operation, the first memory cells MC1, MC3, MC5, and MC7 are programmed as a second threshold voltage which is lower than the first threshold voltage. For example, the first threshold voltage may be in a range of 4 to 6 V. Moreover, the second threshold voltage may be in a range of 0 to 2 V.

An annealing process is then performed on the memory cells MC1 to MC7. A difference exists between electric field levels of adjacent memory cells MC1 to MC7. As a result, charges stored in a data storage layer of the second memory cells MC2, MC4, and MC6 are discharged in a direction to a gate electrode, a direction to a channel layer, and a direction to the adjacent first memory cells MC1, MC3, MC5, and MC7. Further, traps which exist along a path of the charges are removed. Furthermore, since the first memory cells MC1, MC3, MC5, and MC7 are also programmed, regeneration of the traps during the annealing process may be prevented.

In FIG. 4C, data is stored in each of the memory cells MC1 to MC7. The program and annealing processes are repeated several times on the memory cells of an embodiment of the invention, as described with reference to FIGS. 4A and 4B. As a result, the traps are removed from adjacent to the memory cells MC1 to MC7. In particular, the slight program operation is also performed on the first memory cells MC1, MC3, MC5, and MC7, from which the adjacent traps are removed, and then the annealing process is repeated. Accordingly, damage of data stored in all of the memory cells MC1 to MC7 may be prevented.

Figure 5:
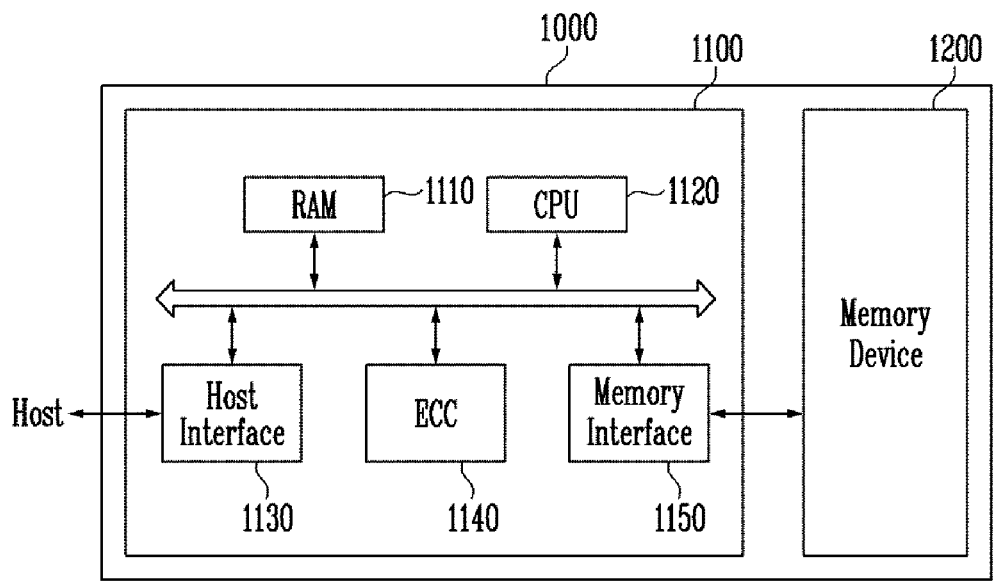
FIGS. 5 and 6 are block diagrams illustrating a structure of a memory system according to an embodiment of the invention.

Referring to FIG. 5, a block diagram illustrating a structure of a memory system according to an embodiment of the invention is shown.

As shown in FIG. 5, the memory system 1000 according to an embodiment of the invention includes a memory device 1200 and a controller 1100.

The memory device 1200 is used to store data information having various data forms such as text, graphics, software codes, and/or the like. The memory device 1200 may be a nonvolatile memory. The memory device 1200 may also include the structure described with reference to FIGS. 1A to 4C. In addition, a structure and a manufacturing method of the memory device 1200 is the same as described above, and a detailed explanation is omitted.

The controller 1100 is electrically coupled to a host Host and the memory device 1200, and is configured to access the memory device 1200 in response to a request of the host Host. For example, the controller 1100 is configured to control read, write, erase, and background operations, and/or the like, of the memory device 1200.

The controller 1100 includes a random access memory (RAM) 1110, a central processing unit (CPU) 1120, a host interface 1130, and an error correction code (ECC) circuit 1140, a memory interface 1150, and/or the like.

The RAM 1110 is configured to be used as an operation memory of the CPU 1120. Further, the RAM 1110 is also configured to be a cache memory interposed between the memory device 1200 and the host Host, a buffer memory interposed between the memory device 1200 and the host Host, and/or the like. For reference, the RAM 1110 may be substituted by a static random access memory (SRAM), a read only memory (ROM), and/or the like.

The CPU 1120 is configured to control overall operations of the controller 1100. For example, the CPU 1120 may be configured to operate firmware such as a flash translation layer (FTL) stored in the RAM 1110, and/or the like.

The host interface 1130 is configured to interface with the host Host. For example, the controller 1100 is configured to communicate with the host Host through at least one of various interface protocols such as a Universal Serial Bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and/or the like.

The ECC circuit 1140 is configured to detect and correct an error included in data read from the memory device 1200 by using an ECC.

The memory interface 1150 is configured to interface with the memory device 1200. For instance, the memory interface 1150 includes a NAND interface or a NOR interface.

For reference, the controller 1100 may further include a buffer memory which temporarily stores data. The buffer memory may be used to temporarily store data transmitted to the outside through the host interface 1130. In the alternative, the buffer memory may temporarily store data transmitted from the memory device 1200 through the memory interface 1150. In addition, the controller 1100 may further include a ROM which stores code data to interface with the host Host.

As described in the above descriptions, the memory system 1000 according to an embodiment of the invention includes the memory device 1200 having the improved data reliability. As a result, data reliability of the memory system 1000 may also be improved.

Figure 6:
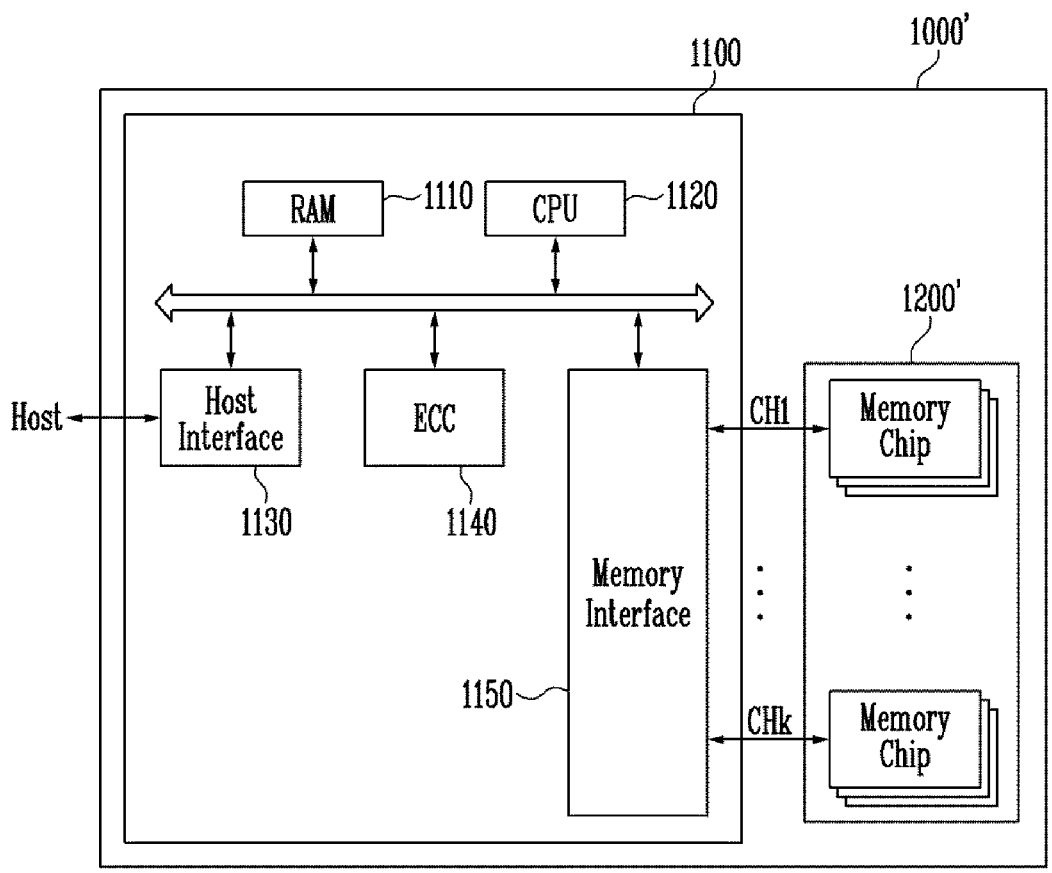

Referring to FIG. 6, a block diagram illustrating a structure of a memory system according to an embodiment of the invention is shown. Repetitive explanations concerning the above-described content will be omitted.

As shown in FIG. 6, the memory system 1000' according to an embodiment of the invention includes a memory device 1200' and a controller 1100. In addition, the controller 1100 includes a RAM 1110, a CPU 1120, a host interface 1130, and an ECC circuit 1140, a memory interface 1150, and/or the like.

The memory device 1200' may be a nonvolatile memory. The memory device 1200' may include the memory string described with reference to FIGS. 1A to 4C. In addition, a structure and a manufacturing method of the memory device 1200' are the same as described above, and thus, a detailed explanation may be omitted.

Further, the memory device 1200' may be a multi-chip package including a plurality of memory chips. The plurality of memory chips are divided into a plurality of groups. In addition, the plurality of groups are configured to communicate with the controller 1100 through first to $k^{th}$ channels CH1 to CHk. Moreover, memory chips included in one group are configured to communicate with the controller 1100 through a common channel. For reference, the memory system 1000' may be changed so that one memory chip is electrically coupled to one channel.

As described in the above descriptions, the memory system 1000' according to an embodiment of the invention includes the memory device 1200' having improved data reliability. Accordingly, data reliability of the memory system 1000' may also be improved. In particular, since the memory device 1200' may constitute the multi-chip package, a data storage capacity of the memory system 1000' may be increased, and a driving speed may be improved.

Figure 7:
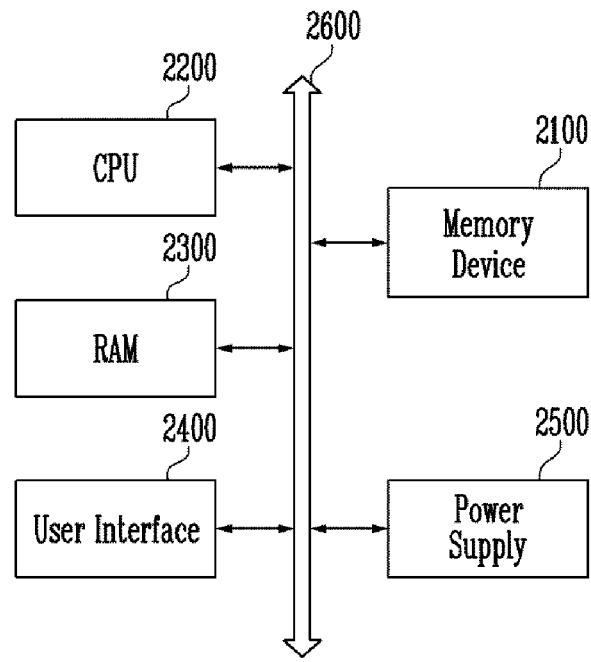
FIGS. 7 and 8 are block diagrams illustrating a structure of a computing system according to an embodiment of the invention.

Referring to FIG. 7, a block diagram illustrating a structure of a computing system according to an embodiment of the invention is described. Repetitive explanations concerning the above-described content will be omitted.

In FIG. 7, the computing system 2000 according to an embodiment of the invention includes a memory device 2100, a CPU 2200, a RAM 2300, a user interface 2400, a power supply 2500, a system bus 2600, and/or the like.

The memory device 2100 stores data provided through the user interface 2400, data processed by the CPU 2200, and/or the like. In addition, the memory device 2100 is electrically coupled to the CPU 2200, the RAM 2300, the user interface 2400, the power supply 2500, and/or the like through the system bus 2600. For example, the memory device 2100 may be electrically coupled to the system bus 2600 through a controller, or directly electrically coupled to the system bus 2600. When the memory device 2100 is directly electrically coupled to the system bus 2600, a function of the controller may be performed by the CPU 2200, the RAM 2300, and/or the like.

The memory device 2100 may be a nonvolatile memory, and may include the memory string described with reference to FIGS. 1A to 4C. In addition, a structure and a manufacturing method of the memory device 2100 is the same as described above, and thus, a detailed explanation may be omitted.

Further, the memory device 2100 may be the multi-chip package described in FIG. 6 which includes a plurality of memory chips.

The computing system 2000 having the above-mentioned structure may be a computer, an ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game player, a navigation device, a black box, a digital camera, a 3-dimensional television, a digital audio recorder, a digital audio player, a digital picture recorder, a digital picture player, a digital video recorder, a digital video player, a device which receives or transmits information in a wireless environment, one of various electronic devices included in a home network, one of various electronic devices included in a computer network, one of various electronic devices included in a telematics network, an RFID device, etc.

As described in the above descriptions, since the computing system 2000 according to an embodiment of the invention includes the memory device 2100 having improved data reliability, data reliability of the computing system 2000 may also be improved.

Figure 8:
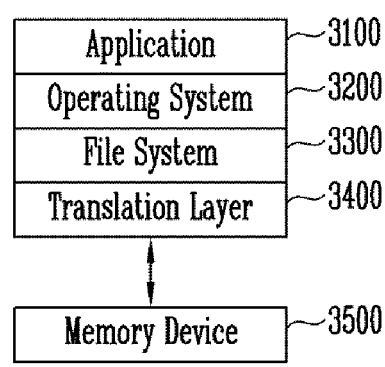

Referring to FIG. 8, a block diagram illustrating a computing system according to an embodiment of the invention is shown.

In FIG. 8, the computing system 3000 according to an embodiment of the invention includes a software layer, which has an operating system 3200, an application 3100, a file system 3300, a translation layer 3400, and/or the like. In addition, the computing system 3000 includes a hardware layer such as a memory device 3500.

The operating system 3200 is configured to manage software, hardware resources, and/or the like, of the computing system 3000, and control program execution of a CPU. The application 3100 may be a utility executed by the operating system 3200 as various application programs which are executed in the computing system.

The file system 3300 denotes a logic structure, which manages data, files, and/or the like, existing in the computing system 3000. The file system 3300 also organizes a file to be stored in the memory device 3500 or data based on a regulation. The file system 3300 may be determined based on the operating system 3200 used in the computing system 3000. For example, when the operating system 3200 is the Windows series of the Microsoft Corporation, the file system 3300 may be a file allocation table (FAT), an NT file system (NTFS), and/or the like. Further, when the operating system 3200 is the Unix/Linux series, the file system 3300 may be an extended file system (EXT), a Unix file system (UFS), a journaling file system (JFS), and/or the like.

In the figure, the operating system 3200, the application 3100, and the file system 3300 are described as individual blocks. However, the application 3100 and the file system 3300 may be included in the operating system 3200.

The translation layer 3400 may change an address into a proper address type of the memory device 3500 in response to a request from the file system 3300. For example, the translation layer 3400 may change a logic address generated from the file system 3300 into a physical address of the memory device 3500. Mapping information of the logic address and the physical address may be stored in the address translation table. For example, the translation layer 3400 may be a flash translation layer (FTL), a universal flash storage link layer (ULL), and/or the like.

The memory device 3500 may be a nonvolatile memory, and include the memory string described with reference to FIGS. 1A to 4C as previously explained. In addition, a structure and a manufacturing method of the memory device 3500 are the same as explained above. Accordingly, a detailed explanation will be omitted.

The computing system 3000 having the above-mentioned structure may be classified into an operating system layer performed in an upper level region and a controller layer performed in a lower level region. The application 3100, the operating system 3200, and the file system 3300 may be included in the operating system layer, and may be operated by an operation memory of the computing system 3000. In addition, the translation layer 3400 may be included in the operating system layer, or the controller layer.

As described in the above descriptions, since the computing system 3000 according to an embodiment of the invention includes the memory device 3500 having the improved data reliability, data reliability of the computing system 3000 may also be improved.

According to the embodiments of the invention, data retention characteristics of the semiconductor device may be improved.

Hereinafter, the invention is explained with reference to the embodiments, it will be apparent to those skilled in the art that various modifications can be made to the above-described embodiments of the invention without departing from the spirit or scope of the invention. The essential technical scope of the invention is disclosed in the appended claims, and it is intended that the invention cover all such modifications provided they come within the scope of the claims and their equivalents.

What is claimed is:

1. A method of manufacturing a semiconductor device, comprising:
   forming memory cells which share a data storage layer, wherein the memory cells include first memory cells arranged in a checker board pattern and second memory cells arranged in a reverse checker board pattern;
   performing a first strong program operation on the first memory cells;
   performing a first annealing process to the first and second memory cells, after the first strong program operation;
   performing a second strong program operation on second memory cells, and
   performing a slight program operation on the first memory cells; and
   performing a second annealing process to the first and second memory cells, after the second strong program operation and the slight program operation.

2. The method of claim 1, wherein the first memory cells are even memory cells and the second memory cells are odd memory cells.

3. The method of claim 1, wherein the data storage layer includes a nitride.

4. The method of claim 1, wherein the first and second strong program operations program the first or second memory cells as a first threshold voltage, and the slight program operation programs the first memory cells as a second threshold voltage lower than the first threshold voltage.

5. A method of manufacturing a semiconductor device, comprising:
   forming memory strings including memory cells;
   programming first memory cells arranged in a checker board pattern among the memory cells as a first threshold voltage;
   performing a first annealing process to remove traps in the first memory cells;
   programming second memory cells arranged in a reverse checker board pattern among the memory cells as the first threshold voltage, and programming the first memory cells as a second threshold voltage lower than the first threshold voltage; and
   performing a second annealing process to remove traps in the second memory cells,
   wherein the memory cells are arranged in 3-dimensions, and each of the memory cells comprises a channel layer formed in a pillar shape, a data storage layer surrounding the channel layer, and a gate electrode surrounding the data storage layer.

6. The method of claim 5, wherein the first memory cells are even memory cells and the second memory cells are odd memory cells.

7. The method of claim 5, wherein the checker board pattern is determined based on memory cells included in one of the memory strings.

8. The method of claim 5, wherein when the memory string is arranged in a U-shape, and the checker board pattern is determined based on memory cells included in a half memory string.

9. The method of claim 5, wherein by the first annealing process, charges stored in the first memory cells are discharged in a direction to the channel layer, a direction to the gate electrode, or a direction adjacent to the second memory cells, and the traps which exist along a corresponding path are removed.

10. The method of claim 5, wherein by the second annealing process, charges stored in the second memory cells are discharged in a direction to the channel layer, a direction to the gate electrode, or a direction adjacent to the first memory cells, and the traps which exist along a corresponding path are neutralized.

11. The method of claim 5, wherein the data storage layer comprises a nitride, and memory cells adjacent to each other in a vertical direction share the data storage layer.

12. A semiconductor device, comprising:
first memory cells configured in a check board pattern and to receive a first strong program operation, a slight program operation, a first annealing process after the first strong program operation and a second annealing process after the slight program operation; and
second memory cells configured in a reverse checker board pattern and to receive a second strong program operation, and the second annealing process after the second strong program operation,
wherein the second memory cells are configured to receive the second strong program operation when the first memory cells are configured to receive the slight program operation.

13. The semiconductor device of claim 12, wherein the first annealing process and the second annealing process are performed more than once.

14. The semiconductor device of claim 12, wherein the first memory cells and the second memory cells are configured to receive the first annealing process after the first strong program operation.

15. The semiconductor device of claim 12, further comprising:
a data storage layer within the second memory cells configured to have charges discharged in a direction adjacent to the first memory cells and to have traps that exist along the path of the charges to be removed.

16. The semiconductor device of claim 12, wherein the first memory cells are configured to have a difference between electric field levels of adjacent memory cells.

17. The semiconductor device of claim 16, further comprising:
a data storage layer within the first memory cells configured to have charges discharged in a direction to the adjacent second memory cells.

18. The semiconductor device of claim 15, wherein the first memory cells are configured to receive the second annealing process when the charges in the data storage layer of the second memory cells are discharged.

* * * * *